United States Patent
Wolfe et al.

[19]

[11] Patent Number: 5,967,837
[45] Date of Patent: *Oct. 19, 1999

[54] ASSEMBLY FOR CONNECTING AN ELECTRIC/ELECTRONIC DEVICE TO A PRINTED CIRCUIT BOARD

[75] Inventors: Bruce M. Wolfe, Carmel, Ind.; Hirofumi Kawano, Miyagi-ken, Japan

[73] Assignee: Alps Automotive, Inc., Carmel, Ind.

[*] Notice: This patent issued on a continued prosecution application filed under 37 CFR 1.53(d), and is subject to the twenty year patent term provisions of 35 U.S.C. 154(a)(2).

[21] Appl. No.: 08/722,412

[22] Filed: Oct. 1, 1996

[51] Int. Cl.$^6$ .............................. H01C 1/01; H01R 23/72
[52] U.S. Cl. .............................. 439/550; 439/58; 439/81; 439/553
[58] Field of Search .................. 338/315, 317; 200/296, 292; 439/553, 550, 551, 83, 78, 572, 81, 82, 58

[56] References Cited

U.S. PATENT DOCUMENTS

| | | | |
|---|---|---|---|
| 2,951,226 | 8/1960 | Gittens | 439/58 |
| 3,596,235 | 7/1971 | Teurlings | 439/65 |
| 3,951,494 | 4/1976 | Romine | 439/81 |
| 4,133,595 | 1/1979 | Pritulsky | 439/441 |
| 4,200,900 | 4/1980 | McGeorge | 361/803 |
| 4,380,003 | 4/1983 | Iwaki et al. | 338/315 |
| 4,755,149 | 7/1988 | de Jong | 439/248 |
| 4,758,168 | 7/1988 | Awakowicz et al. | 439/83 |
| 4,767,342 | 8/1988 | Sato | 439/78 |
| 4,797,110 | 1/1989 | Ponziani et al. | 439/83 |
| 4,897,047 | 1/1990 | Connell et al. | 439/189 |
| 4,934,943 | 6/1990 | Klein | 439/248 |
| 4,934,945 | 6/1990 | Nakamura | 439/75 |
| 5,100,339 | 3/1992 | Sato et al. | 439/354 |
| 5,383,797 | 1/1995 | Seong et al. | 439/135 |
| 5,411,399 | 5/1995 | Okuyama et al. | 439/67 |
| 5,611,699 | 3/1997 | Tanigawa | 439/78 |
| 5,711,680 | 1/1998 | Tsuneaki et al. | 439/83 |

FOREIGN PATENT DOCUMENTS

| | | |
|---|---|---|
| 41-1165 | 2/1966 | Japan . |
| 48-17712 | 5/1973 | Japan . |
| 51-52684 | 12/1976 | Japan . |
| 58-40802 | 3/1983 | Japan . |
| 59-45968 | 3/1984 | Japan . |
| 61-174703 | 10/1986 | Japan . |
| 62-122385 | 8/1987 | Japan . |
| 2-154495 | 6/1990 | Japan . |
| 4-6230 | 2/1992 | Japan . |

*Primary Examiner*—Neil Abrams
*Attorney, Agent, or Firm*—Brinks Hofer Gilson & Lione

[57] ABSTRACT

An assembly for mounting an electric/electronic device (300) to a printed circuit board (PCB) (310) of an electronic system. The printed circuit board (310) is provided with first and second openings (311 and 312, respectively). The assembly includes a connector (320) mounted on a first side of the PCB (310) and the device (300) mounted on a second side of the PCB (310), the device (300) including a bushing (302) which extends through the first opening (311) and is fastened to the connector (320) by a nut (330). Male leads (304) of the device (300) are each plugged into a female terminal opening (324) of the connector (320) through the second opening (312). The connector (320) also includes leads having first ends located in the female terminal (323) for contacting the male device leads (304), and second ends which are soldered to conductive traces formed on the PCB (310) for providing connections between the PCB (310) and the device (300). Nut (330) is used to fasten bushing (302) to connector (320). In alternative embodiments, spring clips (430, 530, or 630) or latches (726, 727, 826, or 827) are used to fasten the bushing to the connector.

13 Claims, 5 Drawing Sheets

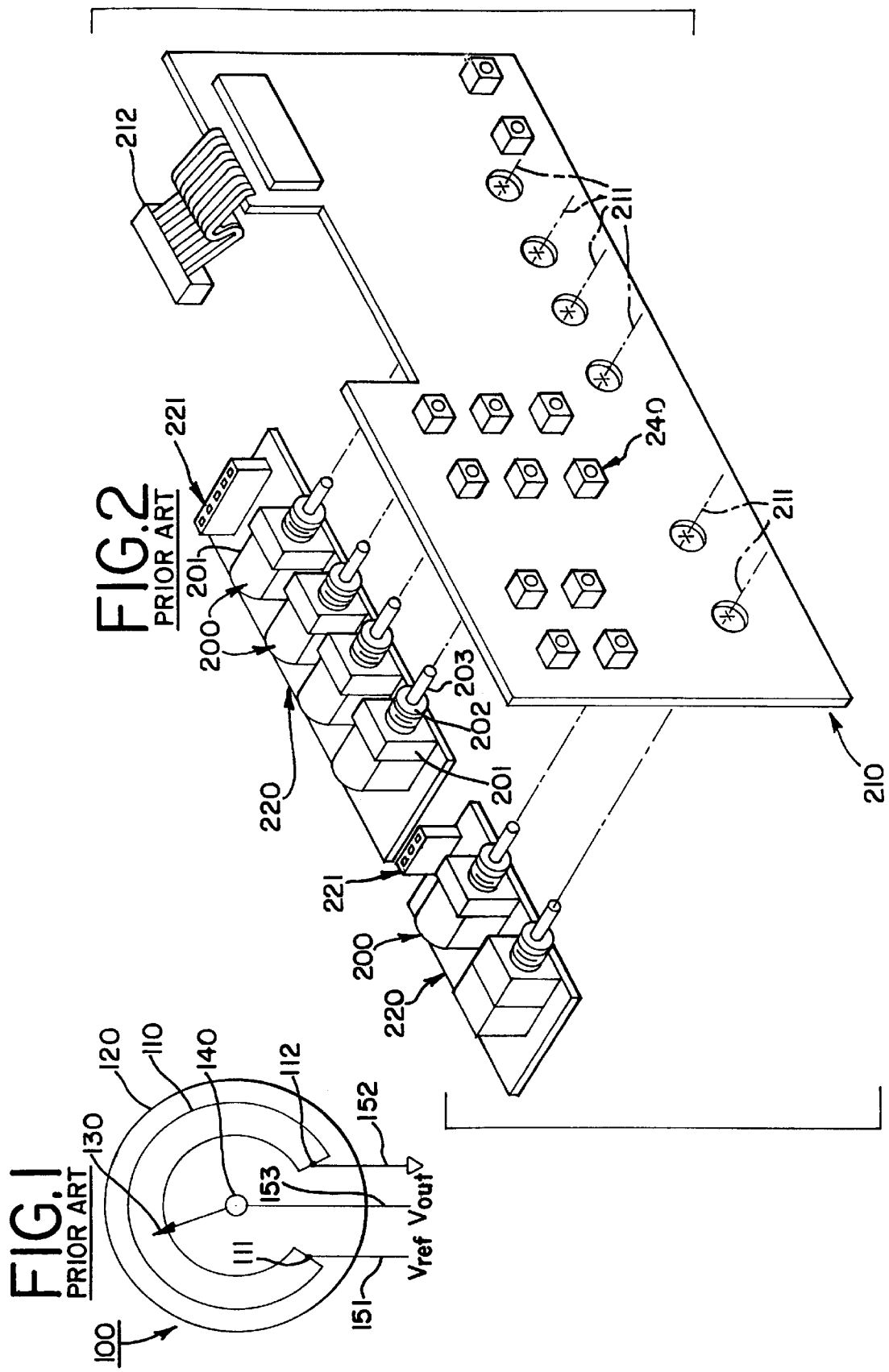

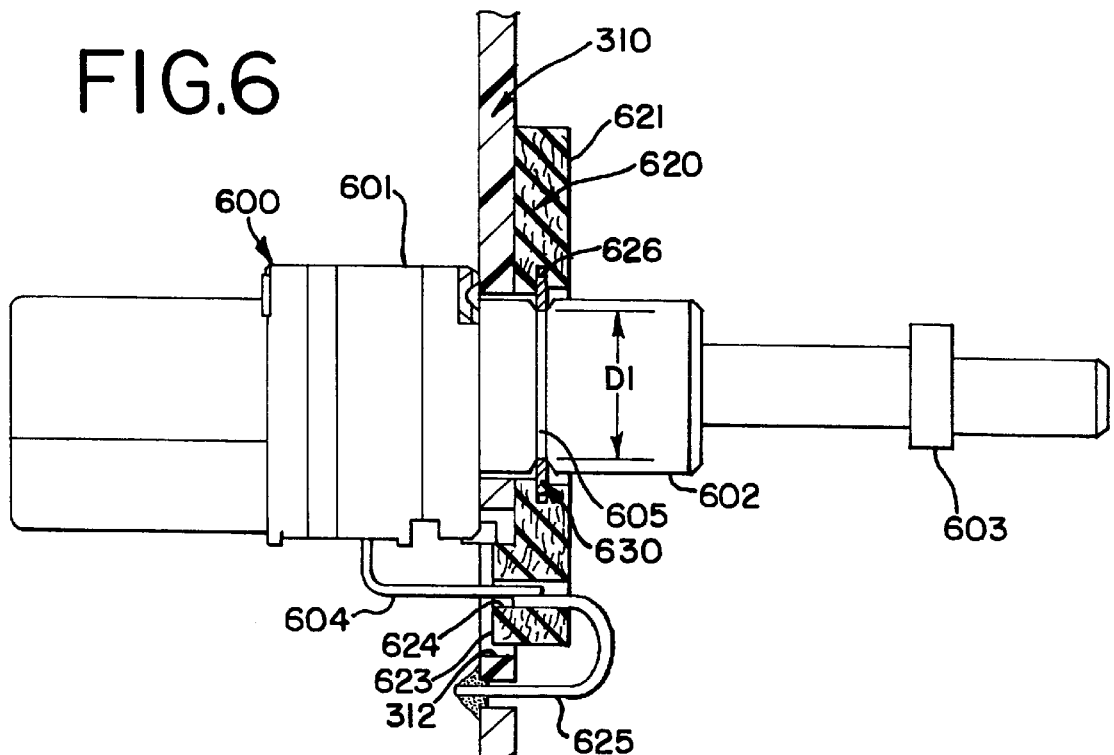
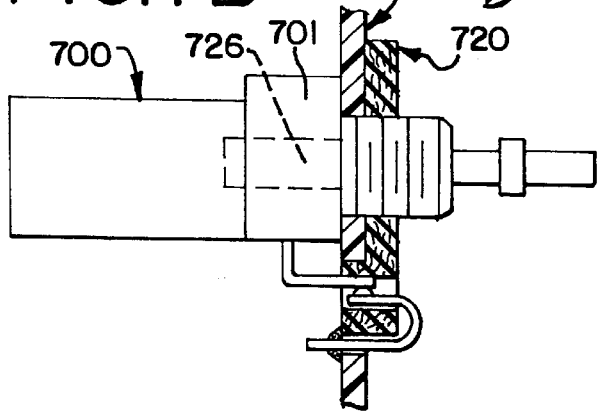
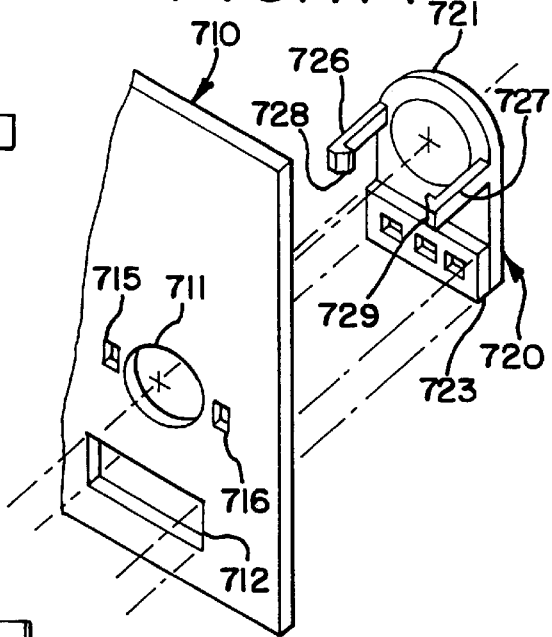
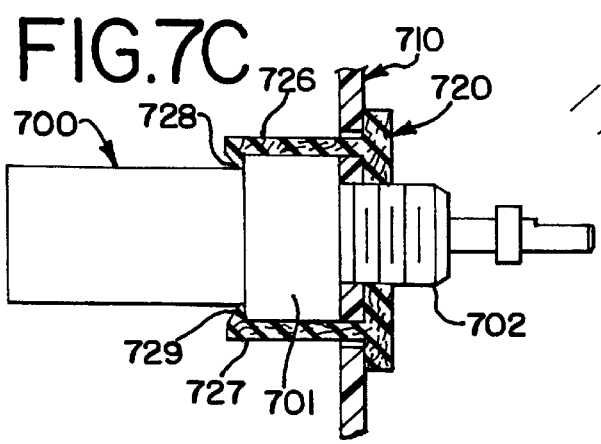

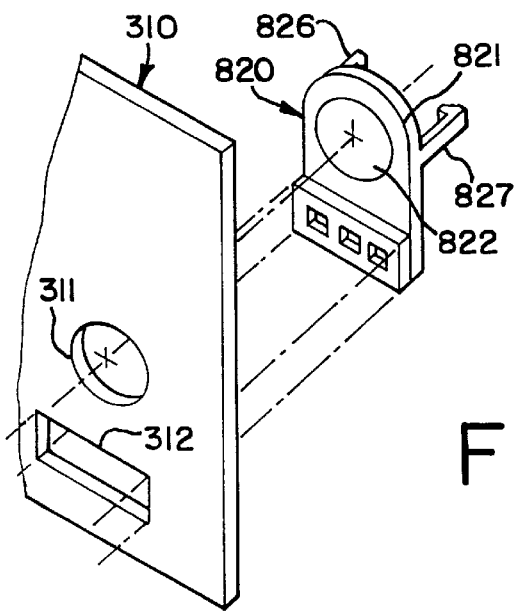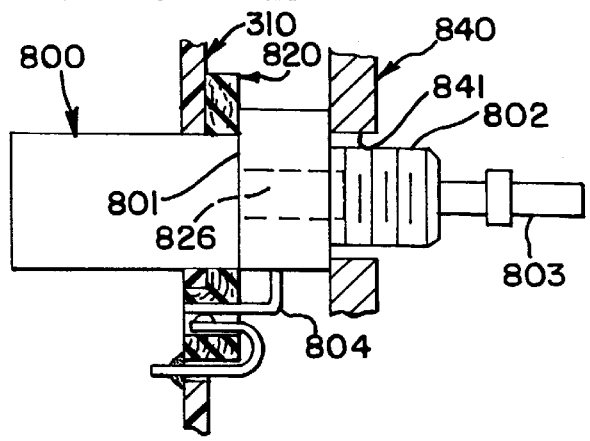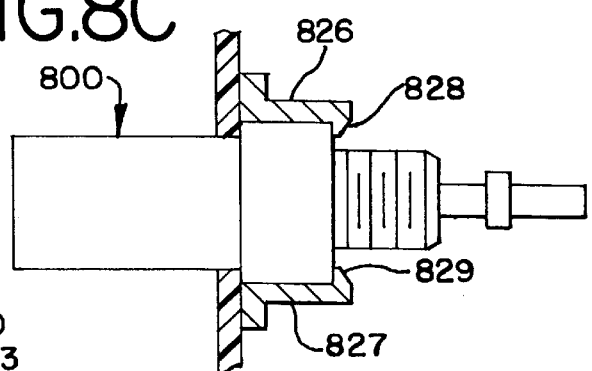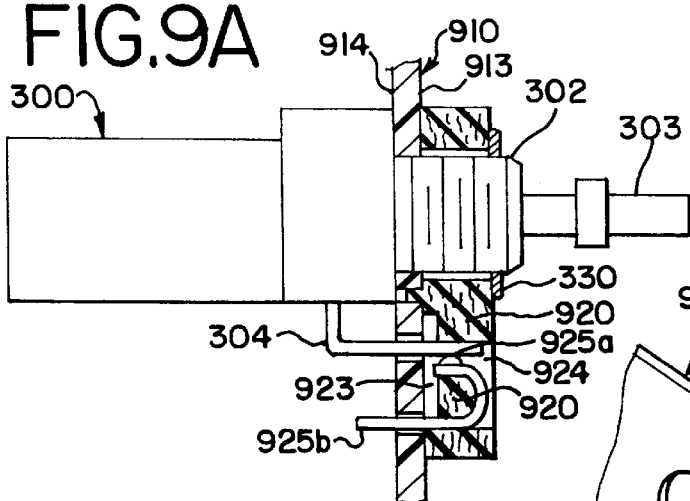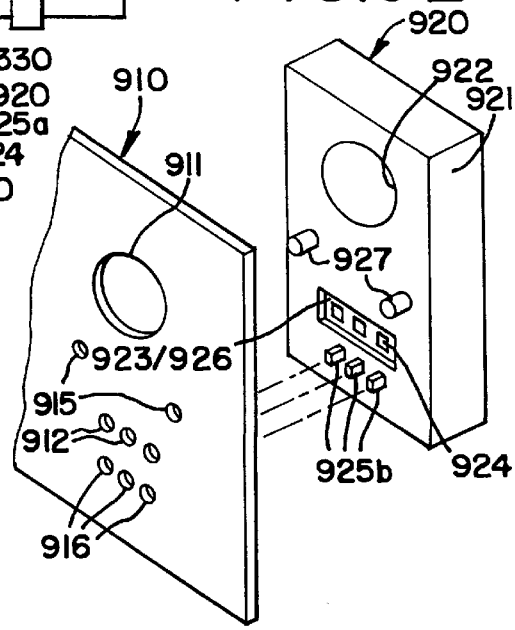

ASSEMBLY FOR CONNECTING AN ELECTRIC/ELECTRONIC DEVICE TO A PRINTED CIRCUIT BOARD

BACKGROUND OF THE INVENTION

1. Field of the Invention

The present invention generally relates to an assembly for mounting an electric or electronic device to a printed circuit board of an electronic system, to an electronic system incorporating the assembly, and to a method for mounting an electric or electronic device to a printed circuit board.

2. Description of the Prior Art

FIG. 1 shows a simplified diagram of a typical potentiometer 100 which is used, for example, as a volume control in a car stereo. The potentiometer 100 includes a C-shaped fixed resistor 110 which is formed on a substrate 120. A wiper contact 130 is mounted on a pivotable shaft 140 (shown in end view) extending through a center of the substrate 120. The wiper contact 130 is positioned to slide along a surface of the fixed resistor 110 as the shaft 140 is manually pivoted in clockwise and counterclockwise directions. A first end 111 of the fixed resistor 110 is connected to a reference potential $V_{REF}$ through a first terminal 151, a second end 112 of the fixed resistor 110 is connected to ground through a second terminal 152, and an output voltage $V_{OUT}$ of the wiper contact 130 is applied to a third terminal 153.

In operation, when the shaft 140 is pivoted fully counterclockwise, the wiper contact 130 is positioned adjacent the first end 111 of the fixed resistor 110, thereby causing $V_{OUT}$ to substantially equal $V_{REF}$. Conversely, when the shaft 140 is pivoted fully clockwise, the wiper contact 130 is positioned adjacent the second end 112 of the fixed resistor 110, causing $V_{OUT}$ to substantially equal 0V (ground). When the shaft 140 is pivoted to position the wiper contact 130 between the first and second ends of the fixed resistor 110, the resulting circuit acts as a voltage divider such that $V_{OUT}$ is a portion of $V_{REF}$ determined by the rotated position of the shaft 140.

Potentiometers are often used as control elements in electronic systems mounted in automobiles, such as stereo volume controls and heater control units. In many applications, the potentiometers are mounted on printed circuit boards (PCBs) which are housed within an electronic system.

FIG. 2 shows a first example of a known structure for mounting potentiometers 200 onto a main PCB 210. Each potentiometer 200 includes a housing 201, which houses the fixed resistor and wiper contact (not shown), and a bushing 202 which extends from the housing 201 and surrounds a base portion of the shaft 203.

In accordance with the known structure shown in FIG. 2, the potentiometers 200 are mounted onto auxiliary PCBs 220 which are then fixedly connected to main PCB 210 using adhesive or a mounting bracket (not shown). The terminals of the potentiometers 200 are soldered to conductive traces (not shown) formed on the surfaces of the auxiliary PCBs 220, and the conductive traces are electrically connected to the pins of a connector 221. When the auxiliary PCBs 220 are mounted to main PCB 210, the bushings 202 and shafts 203 of the potentiometers 200 extend through holes 211, and the bushings are fastened to main PCB 210. Cable connectors 212 are then connected to connectors 221. As shown in FIG. 2, main PCB 210 may also include several push button switches 240 which provide additional control inputs.

A problem with the above-mentioned known structure is that it requires a substantial amount of time to mount the potentiometers onto the main PCB. In addition, if one of the potentiometers fails, it is necessary to disconnect the auxiliary PCB from the main PCB, to disconnect and replace the malfunctioning potentiometer on the auxiliary PCB, and then to reconnect the auxiliary PCB to the main PCB. This causes the overall maintenance costs of the electronic device to be very expensive.

To avoid the problems associated with the first known mounting structure (described above), a second known mounting structure includes the use of vertical mount potentiometers which are mounted and soldered directly onto the main PCB. However, vertical mount potentiometers have a disadvantage in that soldering errors can ruin the main PCB, thereby increasing overall production costs. Further, if one or more of the vertical mount potentiometers fails, it is often less expensive to replace the entire main PCB rather than remove and replace the malfunctioning potentiometer, thereby creating high maintenance costs.

SUMMARY OF THE INVENTION

In accordance with the present invention, an assembly is provided for mounting an electric/electronic device to a printed circuit board (PCB) such that the device is easily mounted to the PCB during production, and easily disconnected from the PCB during maintenance. The assembly includes a connector which is fixedly connected to the PCB and which includes a first mounting structure and a terminal for slidably receiving the leads of the electric/electronic device. The connector also includes leads which extend from the terminal and are soldered to conductive traces formed on the PCB. The assembly also includes a housing in which the electric/electronic device is mounted. The housing is provided with a second mounting structure, and leads of the device extend from the housing in a predetermined direction. When the second mounting structure of the housing is brought into contact with the first mounting structure of the connector, the leads of the device are "plugged" into the terminal of the connector and contact the connector leads, thereby electrically connecting the device to the PCB. The connector leads remain soldered to the PCE even if the device is removed, thereby providing reliable connection between the device and the PCB when the device is mounted. Because connections between the device and the PCB are achieved by plugging the leads into the terminal of the connector, the assembly greatly simplifies the mounting and disconnecting of an electric or electronic device (such as a potentiometer, encoder or switch) to a PCB by obviating the need for soldering the leads of the device to the PCB. Therefore, the assembly lowers production/maintenance costs associated with an electronic system incorporating the device and PCB.

In accordance with a first embodiment of the invention, the connector the connector includes a body which is mounted on a first side of the PCB, a terminal (receiving portion) attached to the body, and one or more connector leads, each connector lead having a first end extending into the receiving portion and a second end which is soldered to the PCB. In addition, the housing includes a threaded bushing and one or more device leads electrically connected to the device and extending from the housing. The bushing is inserted through a hole in the PCB and into an opening formed in the body of the connector. At the same time, the device leads are inserted (plugged) into the terminal of the connector through a second opening in the PCB such that the device leads electrically contact the first ends of the connector leads. When fully inserted, a housing of the potentiometer abuts a second side of the PCB and the bushing is secured to the connector on the first side of the PCB using a nut. Electrical connections between the device leads and the conductive traces formed on the PCB is provided through the connector leads.

In accordance with second, third and fourth embodiments, the bushing of the potentiometer is provided with a groove for receiving a spring clip or a push nut which secure the potentiometer to the connector.

In accordance with fifth and sixth embodiments of the present invention, the connector is provided with resilient arms for snap-coupling to the housing of the potentiometer. In the fifth embodiment, the resilient arms extend through openings formed in the PCB. In the sixth embodiment, the potentiometer is mounted on the same side of the PCB as the connector, and is held against the connector by arms which extend in a direction away from the PCB.

In accordance with a seventh embodiment, a spacer includes positioning protrusions, connector leads and a groove. When the spacer is mounted onto the PCB, the positioning protrusions are received in positioning holes formed in the PCB, the connector leads are received in first lead holes formed in the PCB, and the groove is aligned with second lead holes formed in the PCB. The connector leads are then soldered to the PCB. Then, the potentiometer is mounted onto the PCB such that the external leads of the potentiometer extend through the second lead holes and through the groove into third lead holes formed in the spacer. When inserted into the third lead holes, the ends of the external leads contact ends of the connector leads. The groove spaces the connection point of the external leads and the connector leads away from the PCB, thereby preventing solder and solder flux from sticking to the connector leads and possibly plugging the second lead holes.

Also in accordance with the present invention is a method for mounting an electric/electronic device onto a PCB which includes mounting a connector onto the PCB, soldering leads of the connector to the PCB, then mounting a housing (upon which the device is mounted) onto the connector such that leads extending from the device are plugged into the receiving portion of the connector.

BRIEF DESCRIPTION OF THE DRAWINGS

These and other aspects of the present invention are described in greater detail in the following description which references the appended drawings, in which:

FIG. 1 is a simplified diagram showing the main components of a known potentiometer.

FIG. 2 is a perspective view showing a known structure for mounting potentiometers onto a printed circuit board.

FIG. 6 shows a partial section view of a device mounting assembly according to a fourth embodiment of the present invention.

FIGS. 7A, 7B and 7C show perspective, side section and top section views of various parts of a device mounting assembly in accordance with a fifth embodiment of the present invention.

FIGS. 8A, 8B and 8C show perspective, side section and top section views of various parts of a device mounting assembly in accordance with a sixth embodiment of the present invention.

FIGS. 9A and 9B show side section and perspective views of a device mounting assembly in accordance with a seventh embodiment of the present invention.

DETAILED DESCRIPTION

The following embodiments illustrate an assembly for mounting an electric/electronic device to a printed circuit board in accordance with the present invention. Although the embodiments are directed to an assembly for mounting a potentiometer, the scope of the present invention should not be limited to potentiometers or any particular electric/electronic device (although the present invention is particularly useful for electric/electronic devices incorporating rotating shafts or moving members, such as potentiometers, encoders and mechanical switches). Therefore, the following description is not intended to limit the scope of the appended claims to a particular electric/electronic device.

Figure 3A:
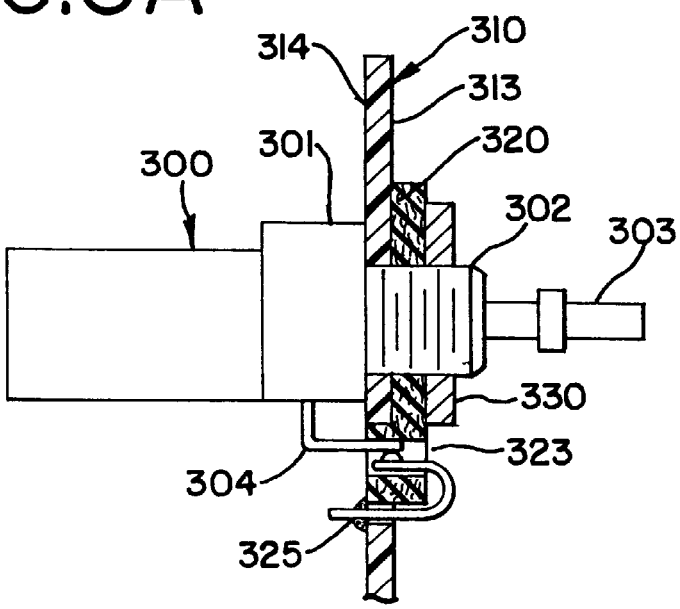
FIGS. 3A and 3B show side section and perspective views of a device mounting assembly in accordance with a first embodiment of the present invention.
Figure 3B:
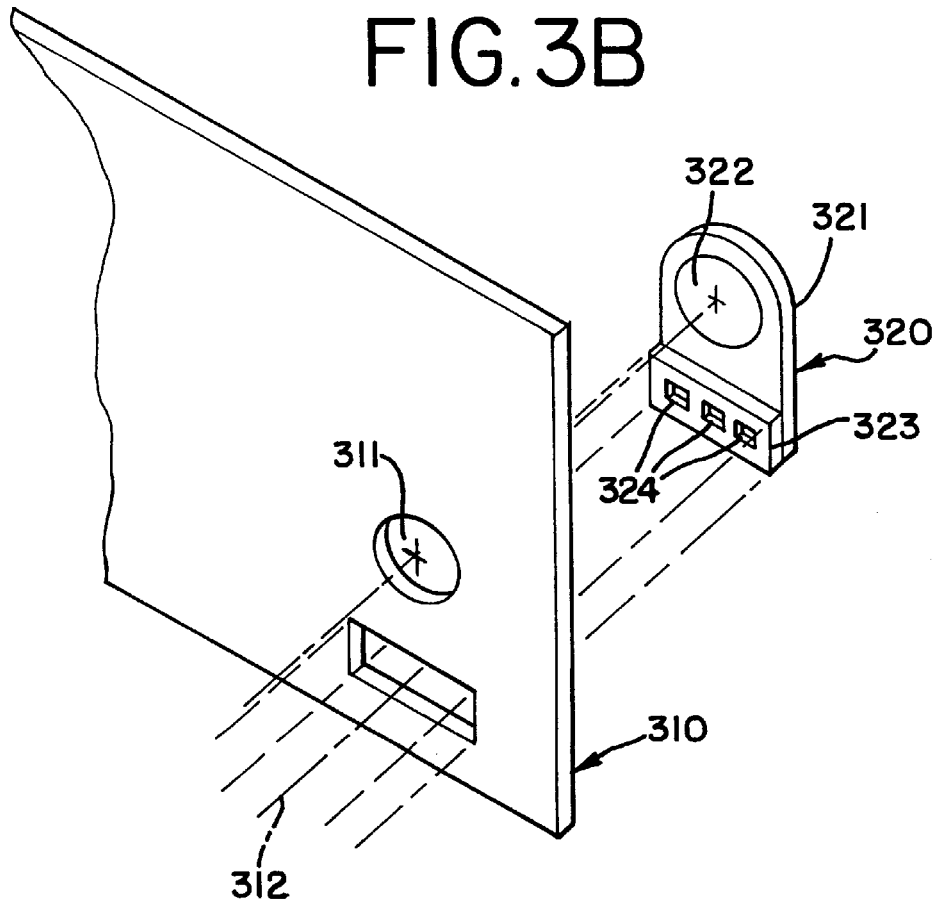

FIGS. 3A and 3B show side section and perspective views of a mounting assembly in accordance with a first embodiment of the present invention. The assembly includes a potentiometer 300 which is mounted on a printed circuit board (PCB) 310 using a connector 320.

Referring to FIG. 3A, the potentiometer 300 includes a housing 301, a bushing 302 extending from the housing 301, and a shaft 303 rotatably mounted in the bushing 302 and connected to a rotary contact (not shown) of the potentiometer 300 mounted within the housing 301. The terminals of the potentiometer 300 are connected to external device leads 304 (one shown) which extend from the housing 301 and are bent forward (toward the bushing 302). The internal portions and operation of the potentiometer 300 are constructed as shown in FIG. 1.

Referring to FIG. 3B, the PCB 310 is provided with a first hole 311 and a second hole 312. The first hole 311 is circular and is slightly larger than an outer diameter of the bushing 302. The second hole 312 is rectangular and is located a predetermined distance below the first hole 311. The printed circuit board 310 also includes conductive traces (not shown) for transmitting signals to and from the potentiometer 300.

The connector 320 includes a flat body 321 provided with an opening 322. As indicated in FIG. 3B, when the connector 320 is mounted on the PCB 310, a center of the opening 322 is aligned with a center of the first hole 311 formed in the PCB 310. The connector 320 also includes a protruding portion (terminal receiving portion) 323 which extends away from the flat body 321 and is shaped to fit into the second opening 312 of the PCB 310. Openings 324 are formed in the protruding portion 323 for receiving the device leads 304 of the potentiometer 300. Finally, the connector 320 includes a set of connector leads 325, each connector lead 325 including a first end inserted into one of the openings 324 and a second end which is soldered to the PCB 310, as shown in FIG. 3A.

In accordance with the first embodiment, the potentiometer 300 is connected to the PCB 310 as follows. First, the connector 320 is mounted onto a first side 313 of the PCB 310 such that the opening 322 of the connector 320 is aligned with the first hole 311 of the PCB 310, and the protruding portion 323 extends into the second opening 312 of the PCB 310. The second ends of the connector leads 325 are then soldered to the conductive traces (not shown) formed on the PCB 310. Subsequently, the potentiometer 300 is mounted onto the PCB 310 by inserting the shaft 303 and bushing 302 through the first hole 311 of the PCB 310 and the opening 322 of the connector 320. When the potentiometer 300 is fully inserted, the housing 301 abuts a second side 314 of the PCB 310, and the device leads 304 are received in (plugged into) the openings 324 of the protruding (receiving) portion 323 such that each device lead 304 contacts the first end of one connector lead 325. Finally, a fastener, such as a nut 330, is connected to the bushing 302, thereby securing the potentiometer 300 against the PCB 310.

The assembly of present invention simplifies the process of mounting the potentiometer onto the PCB because the device leads are removably plugged into the receiving portion of the connector, thereby obviating the need for soldering the potentiometer leads to the PCB.

A further benefit is provided in that, in the event that the potentiometer fails, the malfunctioning potentiometer can be easily removed and replaced without requiring additional soldering.

FIGS. 4A through 8C illustrate several alternative embodiments of the present invention. Structural elements which are used in two or more of the embodiments are designated with common reference numerals.

Figure 4A:
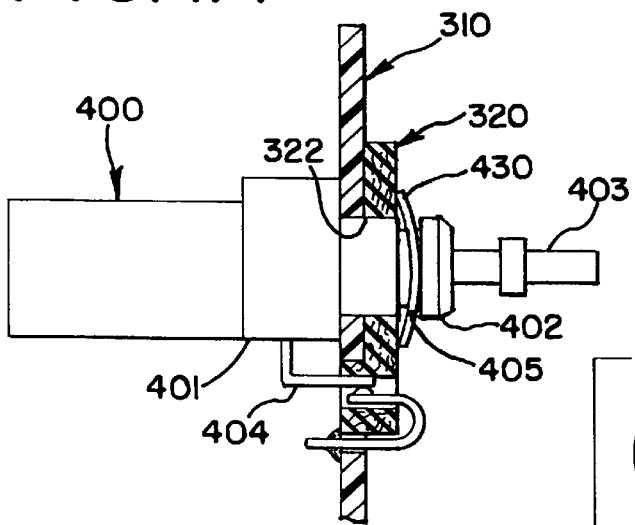
FIGS. 4A and 4B show side section and exploded perspective views of a device mounting assembly in accordance with a second embodiment of the present invention.
Figure 4B:
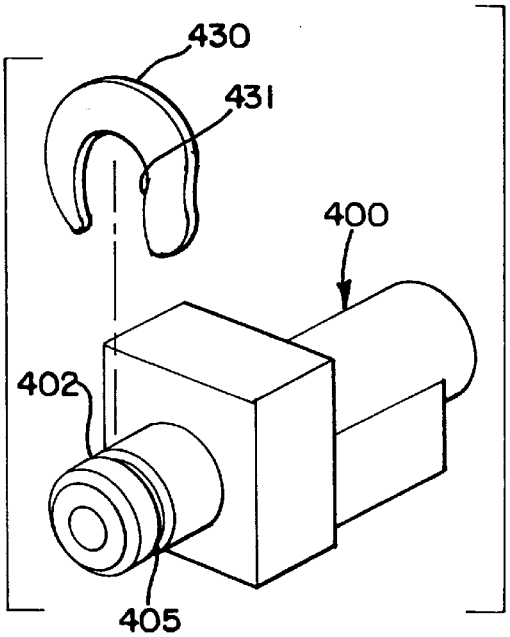

A second embodiment of the present invention is shown in FIGS. 4A and 4B. The second embodiment employs the PCB 310 and connector 320 from the first embodiment (described above). Therefore, further descriptions of these elements are omitted for brevity.

As shown in FIG. 4A, an assembly in accordance with the second embodiment includes potentiometer 400 mounted to the PCB 310 using a spring clip 430 which is received in an annular groove 405 formed in the bushing 402 of the potentiometer 400. The groove 405 is formed on the bushing 402 at a predetermined distance from the housing 401 such that the groove 405 is exposed when the potentiometer 400 is fully inserted. The potentiometer 400 is then secured to the PCB 310 by sliding the spring clip 430 into the groove 405.

Referring to FIG. 4B, the spring clip 430 is a U-shaped member formed from a resilient material, such as spring steel. A slot 431 of the spring clip 430 includes a width which is smaller than an outer diameter of the bushing 402 and larger than a diameter of the annular groove 405. When the spring clip 430 is mounted onto the bushing 402, the spring clip biases the bushing 402 away from the connector 320 (that is, to the right in FIG. 4A), thereby securing the potentiometer 400 against the PCB 310.

An additional benefit is provided by the potentiometer mounting structure according to the second embodiment in that the spring clip 430 reduces assembly costs by reducing the amount of time required to mount the potentiometer 400 onto the PCB 310.

Figure 5A:
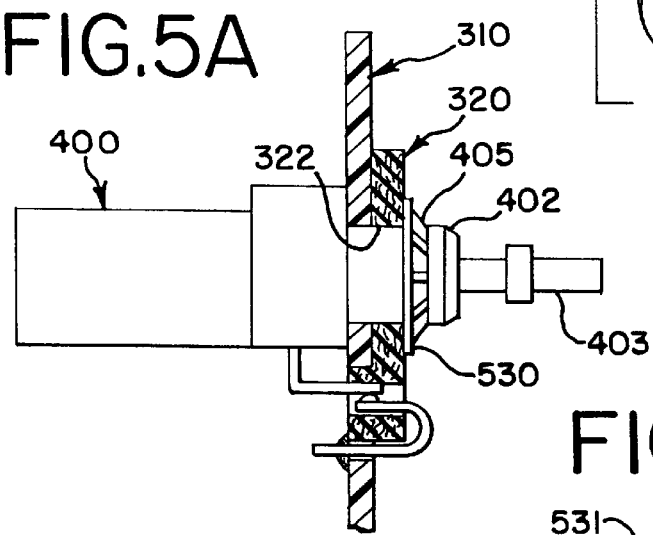
FIG. 5A shows a side section view of a device mounting assembly in accordance with a third embodiment of the present invention.
Figure 5B:
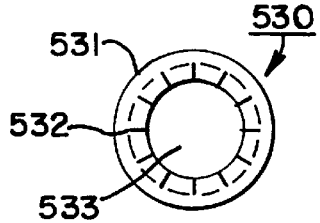
FIGS. 5B and 5C show front and side views of a push nut with the device mounting assembly shown in FIG. 5A.
Figure 5C:
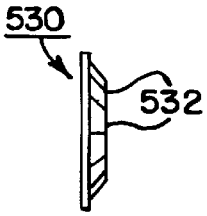

A third embodiment of the present invention is shown in FIGS. 5A, 5B and 5C. The third embodiment incorporates substantially the same PCB 310 and connector 320 which are used in the first and second embodiments (described above), and also incorporates the same potentiometer 400 used in the second embodiment. Therefore, further descriptions of these elements are omitted for brevity.

Referring to FIGS. 5B and 5C, the third embodiment differs from the second embodiment in that a push nut 530 is used in place of the spring clip 430. The push nut 530 includes an outer ring 531 and resilient bent pieces 532 which define a central opening 533. When the potentiometer 400 is mounted onto the PCB 310 such that the bushing 402 protrudes from the hole 322 of the connector 320, the push nut 530 is mounted over the shaft 403 and pressed against an end of the bushing 402. The central opening 533 of the push nut 530 has a diameter which is smaller than the annular groove 405 such that the resilient bent pieces of the push nut 530 are securely received in the groove 405 when the push nut 530 is mounted onto the bushing 402. As with the spring clip 430 of the second embodiment, the push nut 530 biases the bushing 402 away from the connector 320, thereby securing the potentiometer 400 to the PCB 310.

An additional benefit provided by the assembly according to the third embodiment is that the push nut 530 is less likely to become disconnected from the groove 405 than the spring clip 430 of the second embodiment. Otherwise, the benefits of the third embodiment are substantially the same as the second embodiment.

FIG. 6 shows a partial section view of an assembly according to a fourth embodiment of the present invention. In the fourth embodiment, a potentiometer 600 is provided with a groove 605 which is closer to the housing 601 than that of the potentiometer 400 of the second and third embodiments. Further, a connector 620 includes an annular slot 626 formed along an edge of the hole 622, and a resilient clip 630 is mounted in the annular slot 626. The resilient clip 630 has an inner diameter which substantially equal to a diameter D1 of the groove 605. Other features of the potentiometer 600 and the connector 630 are similar to those of the above-described second and third embodiments.

A benefit of the assembly according to the fourth embodiment is that the potentiometer 600 is connected to the PCB 310 without the need for an external connector. That is, the resilient clip 630 is mounted in the annular slot 626 prior to mounting the connector 620 onto the PCB 310, and the resilient clip 630 is not removed during subsequent mounting of the potentiometer 600. Because maintenance personnel are not required to manipulate a fastener, maintenance is simplified even further when compared to the above-described embodiments.

FIGS. 7A, 7B and 7C show perspective, side section and top section views of various parts of an assembly in accordance with a fifth embodiment of the present invention.

Referring to FIG. 7A, a PCB 710 to which the potentiometer 700 is connected includes a first opening 711, a second opening 712, a third opening 715 and a fourth opening 716. A connector 720 includes a first resilient arm 726 and a second resilient arm 727 which are integrally formed with the body 721 and positioned to extend through the third and fourth openings 715 and 716, respectively.

FIGS. 7B and 7C show side and top section views of the assembly after mounting on the PCB 710. As shown, the first and second resilient arms 726 and 727 respectively include fingers 728 and 729 which are snap-coupled to the housing 701 when the potentiometer 700 is fully inserted into the first opening 711 and hole 722.

Benefits of the fifth embodiment are similar to those of the fourth embodiment in that the potentiometer 700 is mounted without a separate fastener.

FIGS. 8A, 8B and 8C respectively show perspective, side section and top section views of various parts of an assembly in accordance with a sixth embodiment of the present invention.

Referring to FIG. 8A, a connector 820 includes a first resilient arm 826 and a second resilient arm 827 which are integrally formed with the body 821 and extend away from the printed circuit board 310.

FIGS. 8B and 8C show side and top section views of the assembly after mounting on the PCB 310. As shown, the potentiometer 800 includes a body 801 and leads 804 which extend downward from the body and are bent in a direction away from the shaft 803 (that is, to the left in FIG. 8B). The potentiometer 800 is mounted on the first side 313 of the PCB 310 against the connector 820. The first and second resilient arms 826 and 827 respectively include fingers 828 and 829 which are snap-coupled to the housing 801 when the potentiometer 800 is fully inserted into the first opening 311 and hole 822. Finally, a bezel 840 having an opening 841 is mounted over the bushing 802 to prevent undesirable movement of the potentiometer 800.

A benefit of the sixth embodiment is that the potentiometer 800 is mounted on the same side of the PCB 310 as the connector 820, thereby simplifying assembly in some applications.

FIGS. 9A and 9B show side section and perspective views of a mounting assembly in accordance with a seventh embodiment of the present invention. The assembly includes the potentiometer 900 which is mounted on a printed circuit board (PCB) 910 using a connector 920.

The potentiometer 900 is essentially identical to that used in the first embodiment (discussed above). Therefore, details of the potentiometer 900 will be omitted here for brevity.

Referring to FIG. 9B, the PCB 910 is provided with a first hole 911, positioning holes 915, first lead holes 912 and second lead holes 916. The first hole 911 is circular and is slightly larger than an outer diameter of the bushing 302 of the potentiometer 900. The positioning holes 915 are located adjacent the first hole 911. The first set of lead holes 912 are located a predetermined distance below the first hole 911. The second set of lead holes 916 are located a predetermined distance below the first lead holes 912. The printed circuit board 910 also includes conductive traces (not shown) for transmitting signals to and from the potentiometer 900.

The connector 920 includes a flat body 921 provided with an opening 922. As indicated in FIG. 9B, when the connector 920 is mounted on the PCB 910, a center of the opening 922 is aligned with a center of the first hole 911 formed in the PCB 910. The connector 920 also defines a groove (terminal receiving portion) 923 which is formed below the first hole such that a thin wall portion 926 is spaced from the PCB 910. A plurality of (third) lead holes 924 are formed through the thin wall portion 926 for receiving the external device leads 904 of the potentiometer 900. A pair of positioning projections 927 extend from the body 921 and are received in the positioning holes 915 when the connector 920 is mounted onto the PCB 910. Finally, the connector 920 includes a set of connector leads 925, each connector lead 925 including a first end 925a inserted into one of the openings 924 and a second (protruding) end 925b which extends from the flat body 921 for soldering to the PCB 910, as shown in FIG. 9A.

In accordance with the seventh embodiment, the potentiometer 900 is connected to the PCB 910 as follows. First, the connector 920 is mounted onto a first side 913 of the PCB 910 such that the opening 922 of the connector 920 is aligned with the first hole 911 of the PCB 910, the groove 923 is positioned over the first lead openings 912, and the protruding ends 925b of the connector leads 925 are inserted into the second lead holes 916. The second ends 925b are then soldered to the conductive traces (not shown) formed on the PCB 910. Subsequently, the potentiometer 900 is mounted onto the PCB 910 by inserting the shaft 303 and bushing 302 through the first hole 911 of the PCB 910 and the opening 922 of the connector 920. When the potentiometer 900 is fully inserted, the housing 301 abuts a second side 914 of the PCB 910, and the device leads 904 extend through the first lead holes 912 and groove 923, and are received in (plugged into) the lead holes 924 of the connector 920 such that each device lead 904 contacts the first end 925a of one connector lead 925. Finally, a fastener, such as a nut 330, is connected to the bushing 302, thereby securing the potentiometer 900 against the PCB 910.

A further benefit provided by the seventh embodiment is that the connection point between the external leads 904 of the potentiometer 900 and the first ends 925a of the connector leads 925 is spaced away from the PCB 910 by the groove 923, thereby preventing solder and solder flux from entering and blocking the second lead holes 916 and (third) lead holes 924 during soldering, thereby providing a positive contact between the potentiometer leads 904 and the connector leads 925.

Although the present invention has been described in considerable detail with reference to numerous embodiments, other versions are possible. For example, one of ordinary skill in the art would recognize that the assembly of the present invention may be used to mount other electric and electronic devices, such as encoders, push-button switches or rotary switches. Further, the mounting structure can incorporate other fastener structures. Therefore, the spirit and scope of the appended claims should not be limited to the description of the embodiments contained herein.

We claim:

1. An assembly for connecting an electric/electronic device to a printed circuit board, the printed circuit board including first and second holes, the assembly comprising:

a connector including a body and a receiving portion fixedly connected to the body, the body including a first opening, the receiving portion including a second opening;

a housing upon which the electric/electronic device is mounted, the housing including a bushing and a device lead electrically connected to the electric/electronic device, the device lead extending from the housing and having an end, wherein when the bushing of the electric/electronic device is inserted through the first hole of the printed circuit board and is received in the first opening of the connector, the end of the device lead is received in the receiving portion of the connector through the second hole in the printed circuit board:

a conductive trace formed on the printed circuit board;

wherein the receiving portion of the connector includes a groove formed in the body such that a thin wall portion is positioned adjacent the groove, the thin wall defining a lead hole, and wherein the connector further includes a connector lead having a first end and a second end, the first end extending into the lead hole formed in the thin wall portion such that the first end contacts the device lead when the device lead is received in the receiving portion, the second end being soldered to the conductive trace.

2. An assembly for mounting a device onto a printed circuit board, the printed circuit board having first and second sides and defining first and second openings, the mounting structure comprising:

a connector mounted on the first side of the printed circuit board, the connector including a body and a receiving portion, the body of the connector defining a hole aligned with the first opening, the connector also including a first plurality of leads having first ends located in the receiving portion and second ends soldered to conductive traces formed on the printed circuit board;

a device including a housing located on the second side of the printed circuit board, the device including a second plurality of leads extending through the second opening and respectively connected to the first ends of the first plurality of leads in the receiving portion of the connector, the device also including a bushing fixedly connected to the housing and extending through the first opening of the printed circuit board and the hole formed in the connector; and means for fastening the device to the connector.

3. The assembly of claim 2, wherein the means for fastening comprises a resilient clip mounted on the connector, the resilient clip releasably engaging a groove formed in the bushing when the bushing is inserted through the first hole into the opening, thereby holding the electric/electronic device against the printed circuit board.

4. An electronic system assembly comprising:

a printed circuit board having first and second sides and defining first and second openings;

a connector mounted on the first side of the printed circuit board, the connector including a body and a receiving portion, the body of the connector defining a hole aligned with the first opening, the connector also including a first plurality of leads having first ends located in the receiving portion and second ends soldered to conductive traces formed on the printed circuit board;

a electric/electronic device including a housing located on the second side of the printed circuit board, the device including a second plurality of leads extending through the second opening and respectively connected to the first ends of the first plurality of leads in the receiving portion of the connector, the device also including a bushing fixedly connected to the housing and extending through the first opening of the printed circuit board and the hole formed in the connector; and means for fastening the device to the connector.

5. The electronic system of claim 4, wherein the means for fastening comprises a resilient clip mounted on the connector, the resilient clip releasably engaging a groove formed in the bushing when the bushing is inserted through the first hole into the opening, thereby holding the electric/electronic device against the printed circuit board.

6. A method for mounting a device onto a printed circuit board, the method comprising the steps of:

mounting a connector onto the printed circuit board such that a hole formed in a body of the connector is aligned with a first opening formed in the printed circuit board and a terminal receiving portion of the connector is aligned with a second opening formed in the printed circuit board;

soldering a first plurality of leads of the connector to the printed circuit board; and mounting the device onto the printed circuit board by inserting a bushing of the device through the first opening of the printed circuit board and the hole formed in the connector such that a second plurality of leads of the device are plugged into the terminal receiving portion of the connector through the second opening of the printed circuit board.

7. The method of claim 6, wherein the connector includes a resilient fastener, and the step of mounting further includes inserting the device until the resilient fastener connects the device to the connector.

8. The method of claim 6, further comprising the step of fastening the device to the connector.

9. An assembly for connecting an electric/electronic device to a printed circuit board, the printed circuit board including first and second holes, the assembly comprising:

a connector including a body and a receiving portion fixedly connected to the body, the body including a first opening, the receiving portion including a second opening;

a housing upon which the electric/electronic device is mounted, the housing including a bushing and a device lead electrically connected to the electric/electronic device, the device lead extending from the housing and having an end, wherein when the bushing of the electric/electronic device is inserted through the first hole of the printed circuit board and is received in the first opening of the connector, the end of the device lead is received in the receiving portion of the connector through the second hole in the printed circuit board;

a conductive trace formed on the printed circuit board, and wherein the connector includes a connector lead having a first end and a second end, the first end being located in the receiving portion such that the first end contacts the device lead when the device lead is received in the receiving portion, the second end being soldered to the conductive trace.

10. The assembly of claim 9, further comprising a fastener mounted on the connector, the fastener releasably engaging the bushing when the bushing is inserted through the first hole into the opening, thereby holding the electric/electronic device against the printed circuit board.

11. The assembly of claim 9, wherein the receiving portion of the connector includes a groove formed in the body such that a thin wall portion is positioned adjacent the groove, the thin wall defining a lead hole, and wherein the first end of said connector lead extends into the lead hole formed in the thin wall portion such that the first end contacts the device lead when the device lead is received in the receiving portion.

12. An electronic system comprising:

a printed circuit board including first and second holes;

a connector attached to the printed circuit board, the connector including a body and a receiving portion fixedly connected to the body, the body including a first opening, the receiving portion including a second opening;

an electric/electronic device including a housing, a bushing fixedly connected to the housing, and a device lead extending from the housing and having an end;

wherein when the bushing of the electric/electronic device is inserted through the first hole of the printed circuit board and is received in the first opening of the connector, the end of the device lead extends through the second hole in the printed circuit board and is received in the receiving portion of the connector;

wherein the connector includes a connector lead having a first end and a second end, the first end being located in the receiving portion such that the first end contacts the device lead when the device lead is received in the receiving portion, the second end being soldered to the conductive trace.

13. The electronic system of claim 12, further comprising a fastener mounted on the connector, the fastener releasably engaging the bushing when the bushing is inserted through the first hole into the opening, thereby holding the electric/electronic device against the printed circuit board.

* * * * *